United States Patent
Hyun et al.

(10) Patent No.: US 10,037,793 B2
(45) Date of Patent: Jul. 31, 2018

(54) SEMICONDUCTOR MEMORY DEVICE AND METHOD FOR OPERATING THE SAME

(71) Applicant: SK hynix Inc., Gyeonggi-do (KR)

(72) Inventors: Sang-Ah Hyun, Gyeonggi-do (KR); Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/398,884

(22) Filed: Jan. 5, 2017

(65) Prior Publication Data

US 2017/0372770 A1 Dec. 28, 2017

(30) Foreign Application Priority Data

Jun. 28, 2016 (KR) .................. 10-2016-0080555

(51) Int. Cl.
*G11C 11/406* (2006.01)
*G11C 11/408* (2006.01)

(52) U.S. Cl.
CPC ..... *G11C 11/40611* (2013.01); *G11C 11/4087* (2013.01)

(58) Field of Classification Search
CPC ................................. G11C 11/40611
See application file for complete search history.

(56) References Cited

U.S. PATENT DOCUMENTS

| | | | | |
|---|---|---|---|---|
| 4,433,331 A | * | 2/1984 | Kollaritsch | H04Q 3/521 326/40 |
| 6,771,558 B2 | | 8/2004 | Kim | |
| 7,852,134 B2 | * | 12/2010 | Moon | G11C 11/406 327/172 |
| 2007/0159905 A1 | * | 7/2007 | Moon | G11C 11/406 365/222 |

* cited by examiner

*Primary Examiner* — Hoai V Ho
*Assistant Examiner* — Jay Radke
(74) *Attorney, Agent, or Firm* — IP & T Group LLP (57) ABSTRACT

A semiconductor memory device includes: a high frequency signal control unit for receiving an external command address signal, removing noise and glitch from the external command address signal and outputting a first command address signal; a pulse width control unit for controlling a pulse width of the first command address signal or maintaining the pulse width of the first command address signal and outputting a second command address signal with a predetermined pulse width; a refresh operation control unit for generating a row address for a refresh operation in response to the second command address signal; and a memory cell array for performing the a refresh operation in response to the row address.

17 Claims, 9 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2016-0080555, filed on Jun. 28, 2016, which is incorporated herein by reference in its entirety.

BACKGROUND

1. Field

Exemplary embodiments of the present invention relate to a semiconductor design technology and more particularly, to a semiconductor memory device capable of controlling a refresh operation.

2. Description of the Related Art

Semiconductor memory devices, such as a Double Data Rate Synchronous Dynamic Random Access Memory (DDR SDRAM) include a plurality of memory banks for storing data. Each of the memory banks includes tens of millions of memory cells including a cell capacitor and a cell transistor. A semiconductor memory device stores data through charging or discharging the cell capacitor.

Theoretically, the amount of charges stored in a cell capacitor shouldn't change unless an operation is performed. However, in reality, charges stored in a cell capacitor may change due to localized voltage differences between the cell capacitor and various peripheral circuits employed in a semiconductor device. Charges may leak out of a charged cell capacitor, or charges may go into a discharged cell capacitor. The change in the amount of charges of a cell capacitor may change the data stored in the cell capacitor, which means that the data stored in the cell capacitor is lost.

Semiconductor memory devices perform a refresh operation in order to prevent data loss due to the aforementioned phenomenon.

Generally, in an active operation such as a write or read operation emphasis is on achieving a high operation speed, while in a refresh operation high performance is more important than high operation speed. Thus, heretofore, semiconductor memory devices may typically perform refresh operations through a Test During Burn-In (TDBI) process by using low-price equipment that supplies a loose clock cycle tCK in order to simplify a process and increase a Test Time Reduction (TTR) efficiency.

However, performing a refresh operation in a semiconductor memory device by employing the TDBI process and using equipment that supply a low clock cycle tCK may make the pulse width of internal signals abnormally wide and may eventually interrupt a normal internal operation of the semiconductor memory device.

SUMMARY

Embodiments of the present invention are directed to a semiconductor memory device that may normally control a refresh operation even through the clock cycle tCK is low.

In accordance with an embodiment of the present invention, a semiconductor memory device includes: a high frequency signal control unit suitable for receiving an external command address signal, for removing noise and glitch from the external command address signal and outputting a first command address signal; a pulse width control unit suitable for controlling a pulse width of the first command address signal or maintaining the pulse width of the first command address signal and outputting a second command address signal with a predetermined pulse width; a refresh operation control unit suitable for generating a row address for a refresh operation in response to the second command address signal; and a memory cell array suitable for performing the refresh operation in response to the row address.

The pulse width control unit may include: a delayer that delays the first command address signal by a predetermined time and generates a delay signal; and a signal combiner that controls the first command address signal to be outputted in the predetermined pulse width or to be outputted while maintaining the pulse width of the first command address signal in response to the first command address signal and the delay signal.

The pulse width control unit may further include: an inverter that generates an inverted signal by inverting the first command address signal.

The delayer may generate a delay signal by delaying the inverted signal by a predetermined time.

When the first command address signal has a narrower pulse width than the predetermined pulse width, the signal combiner may output the first command address signal while maintaining the pulse width of the first command address signal.

When the first command address signal has a wider pulse width than the predetermined pulse width, the signal combiner may adjust the pulse width of the first command address signal into the predetermined pulse width and outputs the first command address signal in the predetermined pulse width.

The signal combiner may include an AND gate.

The signal combiner may include a NOR gate.

When the pulse width of the external command address signal is abnormally narrow, the high frequency signal control unit may decide that the external command address signal includes the noise and the glitch and removes the noise and the glitch from the external command address signal.

The refresh operation control unit may include: a redundancy refresh controller that generates a redundancy refresh command for refreshing a redundancy cell region in response to an auto-refresh command and a redundancy refresh enable signal; an internal second refresh controller that generates a double refresh enable signal for performing a control to perform a double refresh operation in response to the auto-refresh command and a double refresh signal; an internal second refresh command generator that generates a second refresh command for performing a refresh operation two times with respect to the auto-refresh command that is inputted once in response to the double refresh enable signal and the auto-refresh command; a final refresh generator that generates a final refresh command in response to the auto-refresh command, the second refresh command, and a self-refresh command; and a row address controller that generates the row address for refreshing the memory cell in response to the redundancy refresh command and the final refresh command.

The refresh operation control unit may further include: a command decoder that generates the auto-refresh command by decoding the command address signal whose pulse width is adjusted by the pulse width control unit; and a refresh counter that generates the redundancy refresh enable signal by counting the auto-refresh command.

In accordance with another embodiment of the present invention, a method for operating a semiconductor memory device includes: removing noise and glitch from an external command address signal to generate a first command address signal; adjusting a pulse width of the first command address signal, or maintaining the pulse width of the first command address signal to generate a second command address signal with a predetermined pulse width; generating an auto-refresh command based on the second command address signal; and performing an internal refresh operation in response to the auto-refresh command.

The adjusting of the pulse width of the first command address signal, or the maintaining of the pulse width of the first command address signal to generate the second command address signal with the predetermined pulse width may include: maintaining the pulse width of the first command address signal, when the first command address signal has a narrower pulse width than the predetermined pulse width.

The adjusting of the pulse width of the first command address signal, or the maintaining of the pulse width of the first command address signal to generate the second command address signal with the predetermined pulse width may include: adjusting the pulse width of the first command address signal into the predetermined pulse width, when the first command address signal has a wider pulse width than the predetermined pulse width.

The performing of the internal refresh operation in response to the auto-refresh command may include: generating a redundancy refresh enable signal by counting the auto-refresh command; and refreshing a redundancy cell region in response to the auto-refresh command and the redundancy refresh enable signal.

The performing of the internal refresh operation in response to the auto-refresh command may further include: generating a double refresh enable signal for performing a control to perform a double refresh operation in response to the auto-refresh command and/or a double refresh signal; and generating a second refresh command for performing a refresh operation two times with respect to the auto-refresh command that is inputted once in response to the double refresh enable signal and the auto-refresh command.

The performing of the internal refresh operation in response to the auto-refresh command may further include: generating a final refresh command in response to the auto-refresh command, the second refresh command, and a self-refresh command; generating a row address for performing a refresh operation in response to the redundancy refresh command and the final refresh command; and performing a refresh operation in response to the row address.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
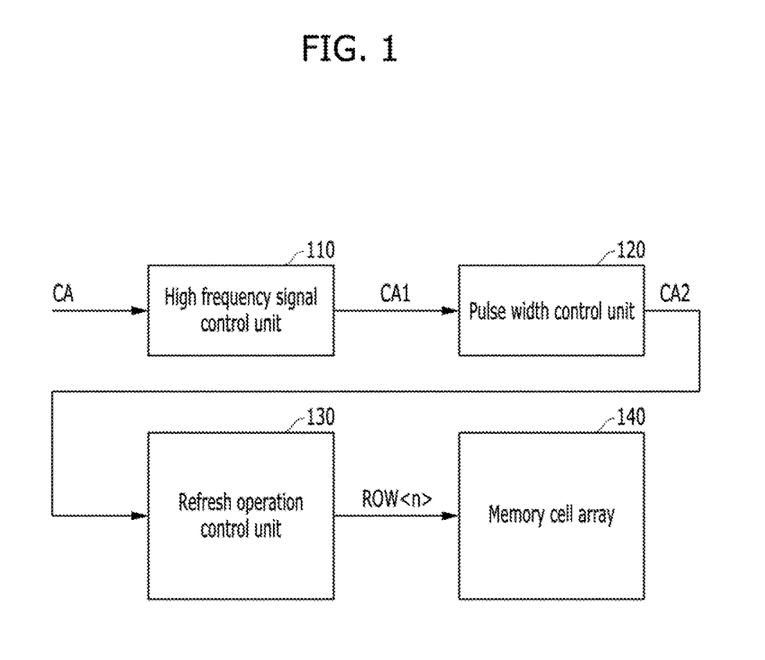
FIG. 1 is a block diagram illustrating a semiconductor memory device, in accordance with an embodiment of the present invention.

FIG. 1 is a block diagram illustrating a semiconductor memory device in accordance with an embodiment of the present invention.

Referring to FIG. 1, the semiconductor memory device may include a high frequency signal control unit 110, a pulse width control unit 120, a refresh operation control unit 130, and a memory cell array 140.

The high frequency signal control unit 110 may receive an external command address signal CA and remove noise signals mixed with noise or glitch signals that are generated abnormally from the command address signal CA. In other words, the high frequency signal control unit 110 may remove noise signals or glitch signals that do not have a normal pulse width but have a very small pulse width from the command address signal CA and output a first command address signal CA1 that is substantially of noise or glitch signals.

The pulse width control unit 120 may receive the first command address signal CA1 from the high frequency signal control unit 110. If the pulse width of the first command address signal CA1 is narrower than a predetermined pulse width, the pulse width control unit 120 may output the first command address signal CA1 as it is as the second command address signal CA2. If the pulse width of the first command address signal CA1 is wider than the predetermined pulse width, the pulse width control unit 120 may perform a control to reduce the wide pulse width of the first command address signal CA1 to the predetermined pulse width and output it as command address signal CA2. For example, when it is assumed that the pulse width control unit 120 is a circuit tuned to maintain the pulse width of approximately 500 ps, signals having a pulse width of approximately 1 ns may be reduced into signals of approximately 500 ps, while signals having a pulse width of approximately 300 ps may be controlled to be outputted as they are.

The refresh operation control unit 130 may receive the second command address signal CA2 from the pulse width control unit 120, and generate a row address ROW<n> for performing an internal refresh operation. For example, the refresh operation control unit 130 may include an internal circuit for controlling a redundancy refresh operation, a smart refresh operation, and a second refresh operation.

The memory cell array 140 may receive the row address ROW<n> and enable a word line corresponding to the row address ROW<n>.

Figure 2:
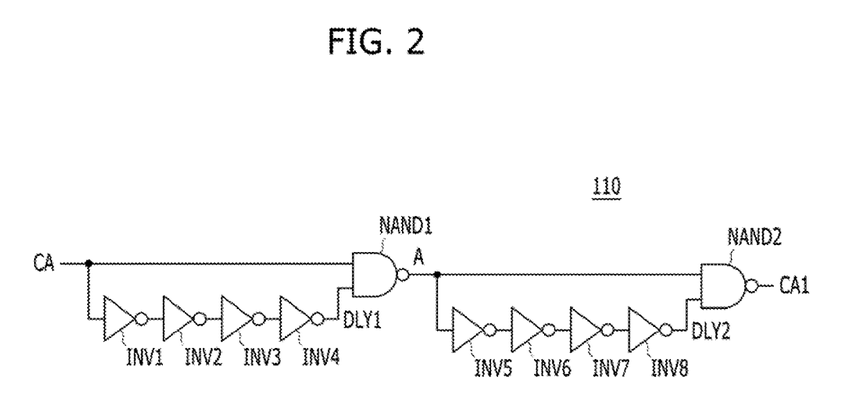
FIG. 2 is a circuit diagram illustrating a high frequency signal control unit shown in FIG. 1.

FIG. 2 is a circuit diagram illustrating a configuration example of the high frequency signal control unit 110 shown in FIG. 1.

Referring to FIG. 2, the high frequency signal control unit 110 may include a plurality of inverters and a plurality of NAND gates. Specifically, the high frequency signal control unit 110 includes inverters INV1, INV2, INV3, INV4, INV5, INV6, INV7 and INV8 and NAND gates NAND1 and NAND2.

The first NAND gate NAND1 may perform a logic operation on the external command address signal CA and a first delay signal DLY1, which is a signal obtained by delaying the external command address signal CA through the first to fourth inverters INV1, INV2, INV3 and INV4, and output an intermediate signal A. The second NAND gate NAND2 may perform a logic operation on the intermediate signal A, received from the first NAND gate NAND1, and a second delay signal DLY2 which is obtained by delaying the intermediate signal A through the fifth to eighth inverters INV5, INV6, INV7 and INV8, and output the first command address signal CA1.

Figure 3A:
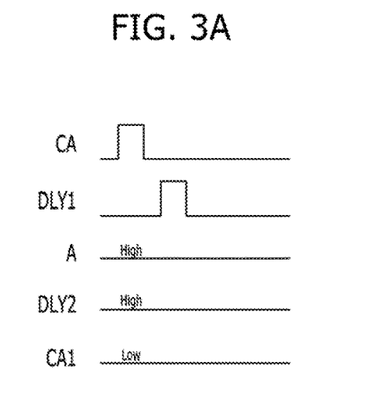
FIGS. 3A and 3B are timing diagrams illustrating examples of an operation of the high frequency signal control unit shown in FIG. 2.
Figure 3B:
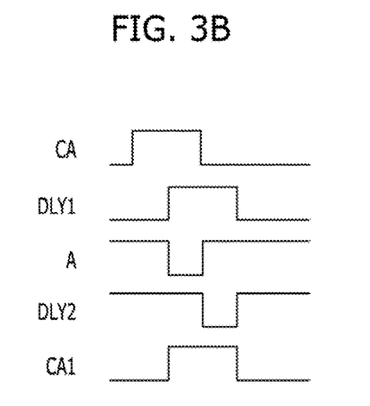

The operation of the high frequency signal control unit 110 will be further described by referring to FIGS. 3A and 3B.

FIGS. 3A and 3B are timing diagrams illustrating examples of the operation of the high frequency signal control unit 110 shown in FIG. 2.

FIG. 3A is a timing diagram illustrating the operation of the high frequency signal control unit 110 when the inputted external command address signal CA is not a normal signal but a noise signal or a glitch signal.

Referring to FIG. 3A, the inputted external command address signal CA is not a signal having a normal pulse width but a signal having a very narrow pulse width, e.g., approximately 10 ps or less, and is therefore a noise signal or a glitch signal.

The first NAND gate NAND1 of FIG. 2 may perform a logic operation on the external command address signal CA and the first delay signal DLY1, which is obtained by delaying the external command address signal CA and output the intermediate signal A having a high logic value.

Therefore, the second delay signal DLY2 may be also a signal having a high logic value. Thus, the first command address signal CA1 outputted from the second NAND gate NAND2 may be outputted in a logic low level.

FIG. 3B is a timing diagram illustrating the operation of the high frequency signal control unit 110 when the inputted external command address signal CA is a signal having a normal pulse width.

Referring to FIG. 3B, the first NAND gate NAND1 of FIG. 2 may perform a logic operation on the external command address signal CA having a normal pulse width and the first delay signal DLY1, which is a signal obtained by delaying the external command address signal CA and output the intermediate signal A. Herein, since the external command address signal CA is a signal having a normal pulse width, there may be a section where the external command address signal CA overlaps with the first delay signal DLY1. Therefore, the intermediate signal A having a predetermined pulse width may be generated. Subsequently, the second NAND gate NAND2 may perform a logic operation on the intermediate signal A and the second delay signal DLY2, which is a signal obtained by delaying the intermediate signal A, and output the first command address signal CA1 having the same pulse width as the external command address signal CA.

To sum up, when the external command address signal CA has a very narrow pulse width (e.g., approximately 10 ps or less), the high frequency signal control unit 110 may decide that the external command address signal CA is not a normal signal but a noise signal or a glitch signal and remove the noise signal or the glitch signal from the inputted external command address signal CA. When the inputted external command address signal CA has a normal pulse width, the high frequency signal control unit 110 may output the external command address signal CA while maintaining the pulse width of the external command address signal CA.

Figure 4A:
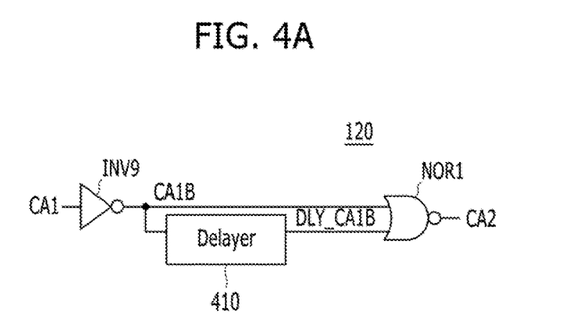
FIG. 4A is a circuit diagram of a pulse width control unit shown in FIG. 1 in accordance with a first embodiment of the present invention.
Figure 4B:
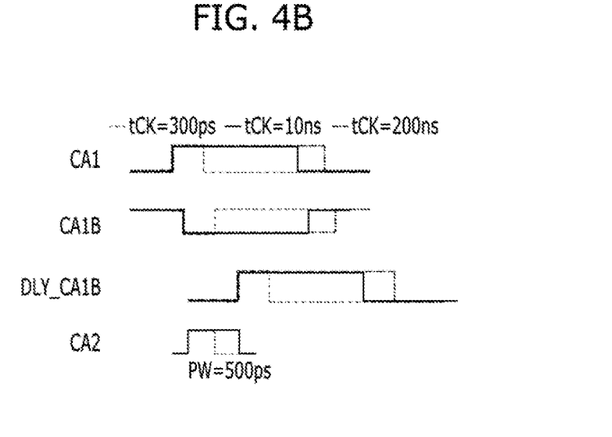
FIG. 4B is an operation timing diagram of a pulse width control unit shown in FIG. 1 in accordance with the first embodiment of the present invention.

FIGS. 4A and 4B are a circuit diagram and an operation timing diagram of the pulse width control unit 120 shown in FIG. 1 in accordance with a first embodiment of the present invention, respectively.

Referring to FIG. 4A, the pulse width control unit 120 may include a ninth inverter INV9, a delayer 410, and a NOR gate NOR1 as a signal combiner.

The ninth inverter INV9 may invert the first command address signal CA1 and output a first command address bar signal CA1B. The delayer 410 may delay the first command address bar signal CA1B by a predetermined duration and output a delay signal DLY_CA1B. The NOR gate NOR1 may perform a logic operation on the first command address bar signal CA1B and the delay signal DLY_CA1B and output the second command address signal CA2.

The operation of the pulse width control unit 120 is described now by referring to FIG. 4B.

Referring to FIG. 4B, the first command address signal CA1 may be inverted and as a result, the first command address bar signal CA1B may be generated. The first command address bar signal CA1B may be delayed by a predetermined duration and as a result, the delay signal DLY_CA1B may be generated. The delay signal DLY_CA1B and the first command address bar signal CA1B may be adjusted in the NOR gate NOR1 to have a predetermined pulse width (e.g., approximately 500 ps) or the delay signal DLY_CA1B and the first command address bar signal CA1B may be outputted while maintaining the pulse width of the inputted first command address signal CA1. Herein, the predetermined pulse width may be determined in the delayer 410. To be specific, the predetermined pulse width may be determined according to the internal operation speed of a circuit. Generally, when the pulse width is approximately 500 ps, it signifies a state that there is no problem in the internal operation margin and the pulse width of approximately 500 ps may be set up. The pulse width does not have to be approximately 500 ps necessarily. The pulse width may be set up differently in an inverter (not shown) of the delayer 410 according to the characteristics of an internal circuit.

Meanwhile, the pulse width control unit 120 may operate in a plurality of cases according to the pulse width of the first command address signal CA1.

In the first place, when the first command address signal CA1 has a pulse width of approximately 300 ps, and the pulse width is smaller than the predetermined pulse width, which is approximately 500 ps (tCK=300 ps, see dotted line), the pulse width control unit 120 may output the second command address signal CA2 while maintaining the pulse width of approximately 300 ps. Herein, the pulse width of approximately 300 ps is smaller than the predetermined pulse width PW, which is approximately 500 ps. Therefore the first command address signal CA1 may be regarded as a glitch signal or a noise signal, but since glitch signals or noise signals have been already removed by the high frequency signal control unit 110, the first command address signal CA1 having the pulse width of approximately 300 ps may be considered as a normal signal. Therefore, the first command address signal CA1 may be outputted while maintaining the pulse width of the first command address signal CA1.

Secondly, there is a case where the pulse width of the first command address signal CA1 is approximately 10 ns (tCK=10 ns, see solid line) or approximately 200 ns tCK=200 ns, see dash dot line). The pulse width of the first command address signal CA1 much wider than the predetermined pulse width PW, which is approximately 500 ps. When the pulse width of an input signal is great abnormally, there may be a section where the operation overlaps with the next operation and malfunction may occur. In this regard, it is important to maintain the pulse width uniformly. Therefore, it is possible to reduce the pulse width of the first command address signal CA1 into the predetermined pulse width (e.g., approximately 500 ps), that is tuned in the delayer 410 and output the second command address signal CA2.

Figure 5A:
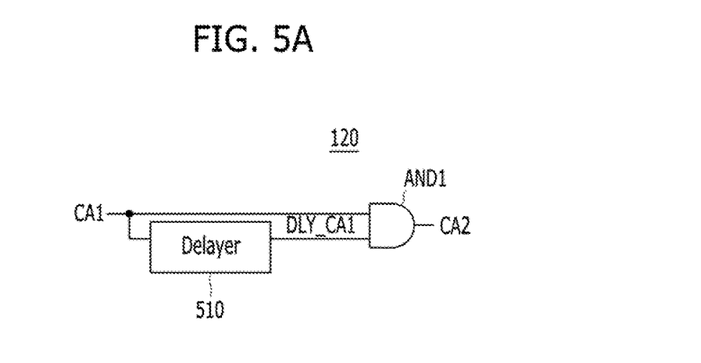
FIG. 5A is a circuit diagram of a pulse width control unit shown in FIG. 1 in accordance with a second embodiment of the present invention.
Figure 5B:
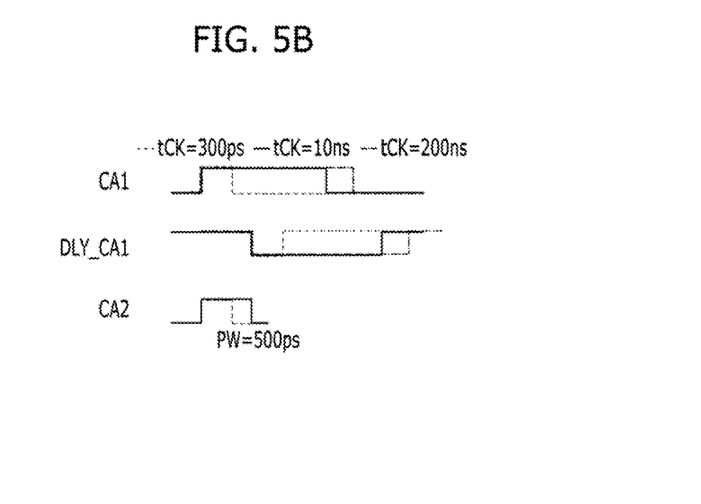
FIG. 5B is an operation timing diagram of a pulse width control unit shown in FIG. 1 in accordance with the second embodiment of the present invention.

FIGS. 5A and 5B are a circuit diagram and an operation timing diagram of the pulse width control unit 120 shown in FIG. 1 in accordance with a second embodiment of the present invention, respectively.

Referring to FIG. 5A, the pulse width control unit 120 may include a delayer 510 and an AND gate AND1 as a signal combiner.

The delayer 510 may delay the first command address signal CA1 by a predetermined section and generate a delay signal DLY_CA1. The AND gate AND1 may perform a logic operation on the first command address signal CA1 and the delay signal DL_CA1 and output the second command address signal CA2.

Hereafter, the operation of the pulse width control unit 120 is described by referring to FIG. 5B.

Referring to FIG. 5B, the AND gate AND1 may perform a logic operation on the first command address signal CA1 and a delay signal DLY_CA1 which is a signal obtained by delaying the first command address signal CA1 by a predetermined duration in order to adjust the first command address signal CA1 to have the predetermined pulse width (e.g., approximately 500 ps), or the inputted first command address signal CA1 may be outputted while maintaining its pulse width as it is. Herein, the predetermined pulse width may be determined in the delayer 510.

In the meantime, the pulse width control unit 120 may operate in a plurality of cases according to the pulse width of the first command address signal CAL Since the operation cases of the pulse width control unit 120 are described above by referring to FIG. 4B, further description is not provided herein.

Figure 6:
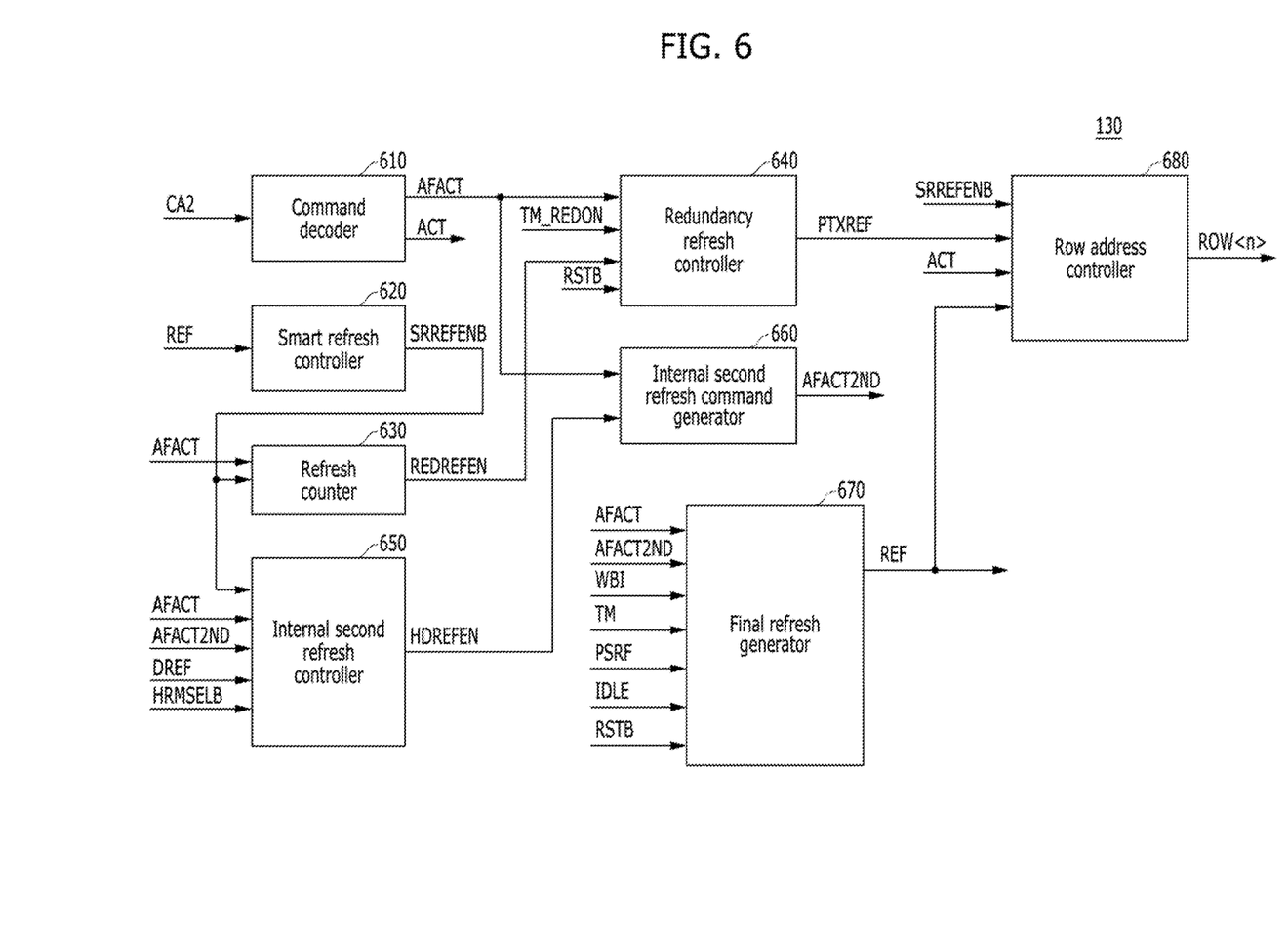
FIG. 6 is a block diagram illustrating a refresh operation control unit shown in FIG. 1.

FIG. 6 is a block diagram illustrating a refresh operation control unit 130 shown in FIG. 1.

Referring to FIG. 6 the refresh operation control unit 130 may include a command decoder 610, a smart refresh controller 620, a refresh counter 630, a redundancy refresh controller 640, an internal second refresh controller 650, an internal second refresh command generator 660, a final refresh generator 670, and a row address controller 680.

The command decoder 610 may generate a plurality of command signals AFACT and ACT in response to the second command address signal CA2. The command signals AFACT and ACT may include an auto-refresh command AFACT, an active command ACT and the like. Herein, the second command address signal CA2 may be a signal whose pulse width is adjusted by the pulse width control unit 120.

The smart refresh controller 620 may generate a smart refresh enable signal SRREFENB for performing a smart refresh operation with respect to a target row address (not shown) in response to a final refresh command REF. Herein, the target row address (not shown) may be an n−1/n+1 row address with respect to a target row address ROW<n>. The final refresh command REF may be generated by the final refresh generator 670, which will be described later on.

The refresh counter 630 may generate a redundancy refresh enable signal REDREFEN in response to the auto-refresh command AFACT and the smart refresh enable signal SRREFENB. For example, the refresh counter 630 may count the auto-refresh command AFACT and generate the redundancy refresh enable signal REDREFEN for refreshing not a normal cell but a redundancy cell at every eighth auto-refresh command AFACT.

The redundancy refresh controller 640 may generate a redundancy refresh command PTXREF in response to the auto-refresh command AFACT, a redundancy refresh control signal TM_REDON, the redundancy refresh enable signal REDREFEN, and a reset signal RSTB. Herein, a redundancy cell region may be region for repairing a failure cell, when a failure cell occurs in a normal cell region.

The internal second refresh controller 650 may generate a double refresh enable signal HDREFEN in response to the smart refresh enable signal SRREFENB, the auto refresh command AFACT, a second refresh command AFACT2ND, a double refresh signal DREF, and a section selection signal HRMSELB. The double refresh enable signal HDREFEN is a signal for doubling i.e., increasing by two times the number of refresh operations in response to one auto-refresh command AFACT inputted once, and the double refresh enable signal HDREFEN may be applied to all refresh operation. The double refresh enable signal HDREFEN may also be applied not to all the refresh operations but to some refresh operations of a predetermined section. The double refresh enable signal HDREFEN may be controlled based on whether the section selection signal HRMSELB is enabled or not. Also, when the internal second refresh controller 650 generates the double refresh enable signal HDREFEN which performs a control to internally perform a refresh operation twice when the auto-refresh command AFACT is inputted once, an operation for resetting the refresh operation so that the internal refresh operation is not performed three times is required. Such reset operation may be controlled based on the second refresh command AFACT2ND.

The double refresh signal DREF and the section selection signal HRMSELB may be generated in an auto-refresh operation number control circuit (not shown).

The internal second refresh command generator 660 may generate the second refresh command AFACT2ND in response to the double refresh enable signal HDREFEN, which is generated by the internal second refresh controller 650. The second refresh command AFACT2ND may be a command for performing a refresh operation two times in a predetermined section, although the auto-refresh command AFACT is inputted once. Meanwhile, the predetermined section is a refresh row cycle time tRFC which may be an active-precharge time tRP that has to be secured minimally.

The final refresh generator 670 may generate the final refresh command REF in response to the auto-refresh command AFACT, the second refresh command AFACT2ND, a wafer burn-in signal WBI, a test mode signal TM, a self-refresh command PSRF, an idle signal IDLE, and the reset signal RSTB.

The final refresh generator 670 may generate the final refresh command REF for refreshing the memory cell array 140 of FIG. 1, when any one command among the self-refresh command PSRF, the auto-auto-refresh command AFACT, and the second refresh command AFACT2ND that is generated based on the auto-refresh command AFACT.

Meanwhile, when a product is tested and a burn-in operation is performed in a wafer, a refresh command may be inputted as a test mode signal TM. The wafer burn-in signal WBI and the test mode signal TM may be the commands inputted for the purpose.

The idle signal IDLE is a signal that is generated when the refresh rove cycle time tRFC passes after the external command address signal CA is inputted. The idle signal IDLE performs a control to make other normal operations performed after a refresh operation ends.

The row address controller 580 may enable the row address ROW<n> in response to the smart refresh enable signal SRREFENB, the redundancy refresh command PTXREF, the active command ACT, and the final refresh command REF.

The row address controller 680 may perform a control to enable the n−1/n+1 row addresses with respect to the target row address ROW<n>, when a smart refresh operation is performed.

Also, when a refresh operation is performed for a redundancy cell region, the row address controller 680 may perform a control to enable the row address ROW<n> that corresponds to the redundancy cell region in response to the redundancy refresh command PTXREF.

Figure 7:
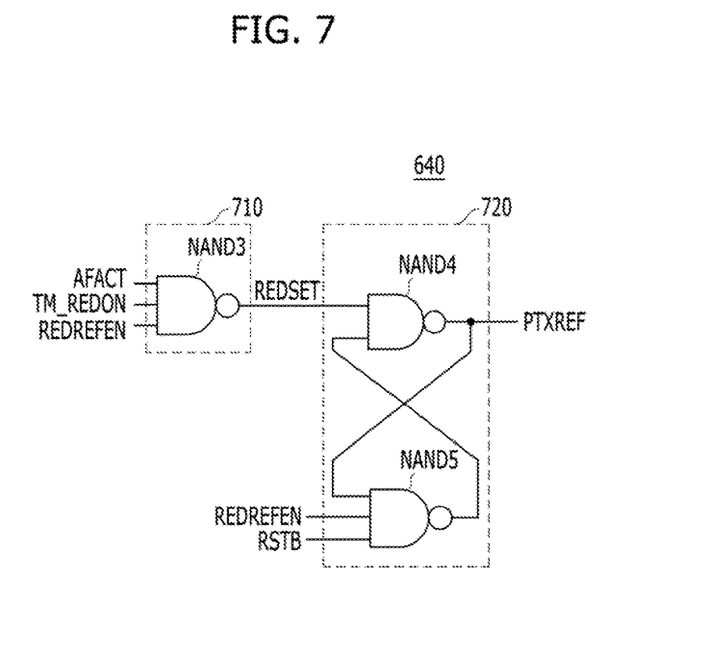
FIG. 7 is a circuit diagram illustrating a redundancy refresh controller shown in FIG. 6.

FIG. 7 is a circuit diagram illustrating a configuration example of the redundancy refresh controller 640 shown in FIG. 6.

Referring to FIG. 7, the redundancy refresh controller 640 may include a set signal generator 710 and a latch 720.

The set signal generator 710 may be formed of a NAND gate NAND3. The set signal generator 710 may perform a logic operation on the auto-refresh command AFACT, the redundancy refresh control signal TM_REDON and the redundancy refresh enable signal REDREFEN and generate a redundancy set signal REDSET.

The latch 720 may include an SR latch that is formed of two NAND gates NAND4 and NAND5. The latch 720 may receive the redundancy set signal REDSET as a set signal, receive the redundancy refresh enable signal REDREFEN or the reset signal RSTB as a reset signal, and generate the redundancy refresh command PTXREF. The redundancy refresh command PTXREF may be enabled in response to the redundancy set signal REDSET, and may be disabled in response to the redundancy refresh enable signal REDREFEN or the reset signal RSTB.

Hereafter, the operation of the redundancy refresh controller 640 is described with reference to FIGS. 8A and 8B.

Figure 8A:
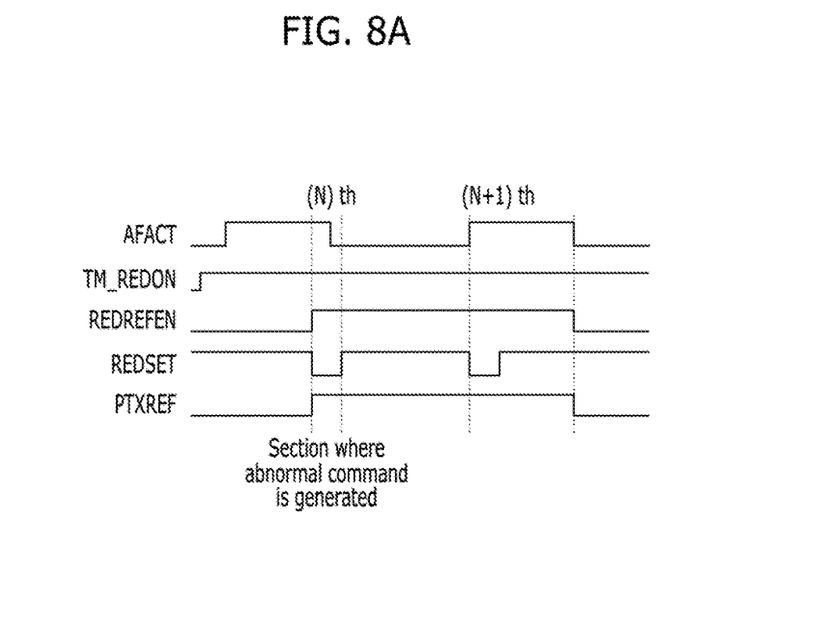
FIGS. 8A and 8B are timing diagrams illustrating examples of an operation of the redundancy refresh controller shown in FIG. 7.
Figure 8B:
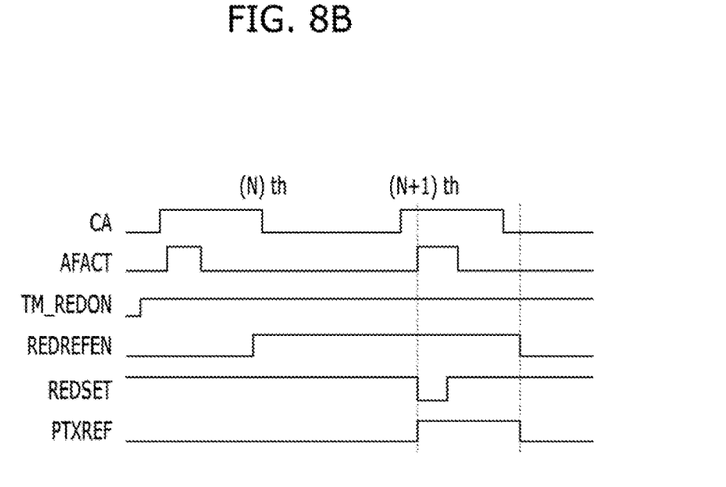

FIGS. 8A and 8B are timing diagrams illustrating examples of an operation of the redundancy refresh controller 640 shown in FIG. 7.

FIG. 8A is a timing diagram illustrating the operation of the redundancy refresh controller 640 in accordance with a comparative example of the present invention.

The auto-refresh command AFACT shown in FIG. 8A may be generated based on the external command address signal CA that does not go through the pulse width control unit 120. Therefore, the auto-refresh command AFACT may have a wider pulse width than the predetermined pulse width (e.g., approximately 500 ps).

The redundancy refresh enable signal REDREFEN is a signal for performing a control to refresh the redundancy cell region in the eighth refresh operation during an auto-refresh operation. The redundancy refresh enable signal REDREFEN may be enabled at a timing when the seventh refresh operation ends. Herein, an $N^{th}$ auto-refresh command AFACT may be generated for performing the seventh refresh operation, which is a normal refresh operation, and an $(N+1)^{th}$ auto-refresh command AFACT may be generated for performing the eighth refresh operation, which is a redundancy refresh operation.

Therefore, the redundancy set signal REDSET may be enabled in response to the enabling of the redundancy refresh enable signal REDREFEN, and thereby the redundancy refresh command PTXREF may be generated.

Referring again to FIG. 8A, however, the redundancy refresh enable signal REDREFEN may be generated before an enabling section of the $N^{th}$ auto-refresh command AFACT ends. Since the refresh operation ends before the enabling section of the auto-refresh command AFACT ends, there may be a section where the pulse widths overlap. Therefore, the redundancy refresh command PTXREF is enabled not in an enabling section of the $(N+1)^{th}$ auto-refresh command AFACT but in an enabling section of the $N^{th}$ auto-refresh command AFACT, and the refresh operation is performed not in the normal cell region but in the redundancy cell region during the seventh refresh operation, malfunction may be caused.

FIG. 8B is a timing diagram illustrating the operation of the redundancy refresh controller 640 in accordance with an embodiment of the present invention.

Referring to FIG. 8B, the external command address signal CA having a wider pulse width than the predetermined pulse width e.g., approximately 500 ps) may be adjusted to have the predetermined pulse width by the pulse width control unit 120, and outputted as the second command address signal CA2 (not shown). Since the auto-refresh command AFACT is generated based on the second command address signal CA2 having the predetermined pulse width, the outputted auto-refresh command AFACT may have the predetermined pulse width.

Therefore, the redundancy refresh enable signal REDREFEN may be enabled at a moment when the seventh normal refresh operation ends, which is after the $N^{th}$ enabling section of the auto-refresh command AFACT ends. Therefore, the redundancy refresh command PTXREF may be enabled at a moment when the auto-refresh command AFACT is enabled (N+1) times, which is the normal eighth refresh operation section. Thus, it is possible to normally perform a refresh operation on the redundancy cell region.

Figure 9:
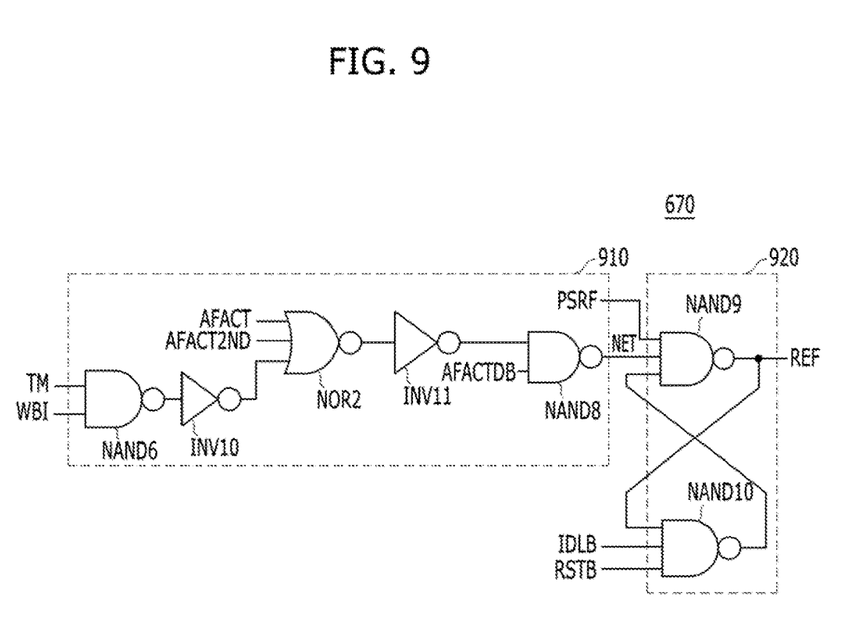
FIG. 9 is a circuit diagram illustrating a final refresh generator shown in FIG. 6.

FIG. 9 is a circuit diagram illustrating an example of the final refresh generator 670 shown in FIG. 6.

Referring to FIG. 9, the final refresh generator 670 may include a set signal generator 910 and a latch 920.

The set signal generator 910 may include a plurality of NAND gates NAND6 and NAND8, a plurality of inverters INV10 and INV11, and a NOR gate NOR2.

The sixth NAND gate NAND6 may perform a logic operation on the test mode signal TM and the wafer burn-in signal WBI and output an output signal. The NOR gate NOR2 may perform a logic operation on the auto-refresh command AFACT, the second refresh command AFACT2ND, and a signal that is obtained by inverting the output signal outputted from the sixth NAND gate NAND6 by the $10^{th}$ inverter INV10, and output the logic operation result. In other words, the NOR gate NOR2 may be able to output a signal having a logic low level, when at least one signal among the auto-refresh command AFACT, the second refresh command AFACT2ND, and the signal that is obtained by inverting the output signal outputted from the sixth NAND gate NAND6 by the $10^{th}$ inverter INV10, is enabled.

The eighth NAND gate NAND8 may perform a logic operation on a signal obtained by inverting a signal outputted from the NOR gate NOR2 by the $11^{th}$ inverter INV11 and a delayed/inverted auto-refresh command AFACTDB, and output a net signal NET. Herein, the delayed/inverted auto-refresh command AFACTDB may be a signal maintaining a predetermined pulse width regardless of the pulse width because the delayed/inverted auto-refresh command AFACTDB is generated through self-generation (not shown) based on the pulse of the auto-refresh command AFACT.

In short, the set signal generator 910 may generate the net signal NET in response to the auto-refresh command AFACT or the second refresh command AFACT2ND.

The latch 920 may include an SR latch that is formed of a plurality of NAND gates NAND9 and NAND10. The latch 920 may receive a self-refresh command PSRF or the net signal NET as a set signal, receive the idle signal IDLE or the reset signal RSTB as a reset signal, and generate the final refresh command REF.

The final refresh command REF is enabled in response to one signal among the self-refresh command PSRF, the auto-refresh command AFACT, and the second refresh command AFACT2ND, and disabled in response to the idle signal IDLE or the reset signal RSTB.

Figure 10A:
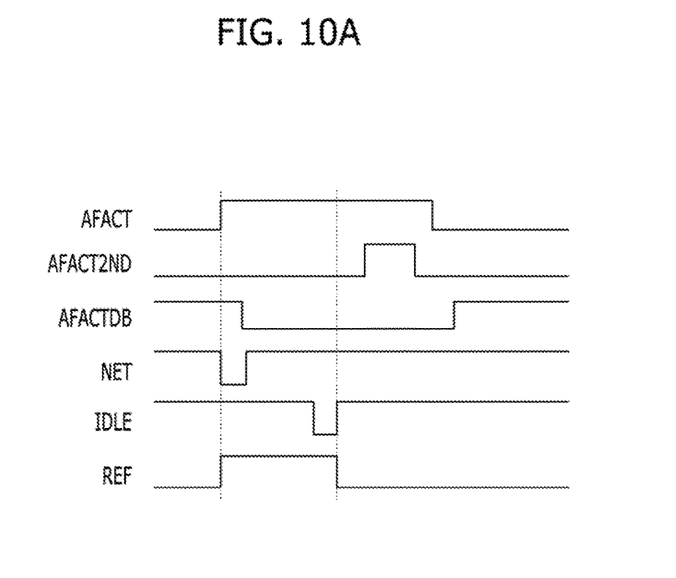
FIGS. 10A and 10B are timing diagrams illustrating examples of an operation of the final refresh generator shown in FIG. 9.
Figure 10B:
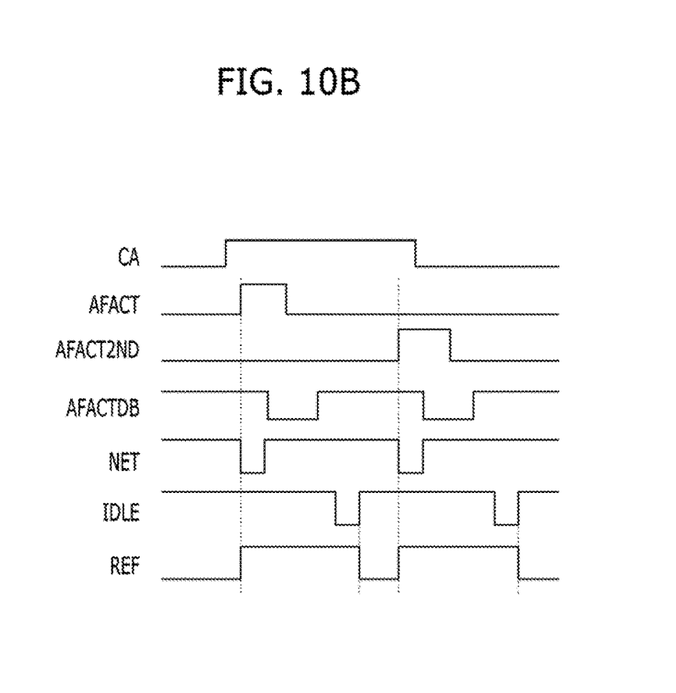

Hereafter, the operation of the final refresh generator 670 is described by referring to FIGS. 10A and 10B.

FIGS. 10A and 10B are timing diagrams illustrating examples of the operation of the final refresh generator 670 shown in FIG. 9.

FIG. 10A is a timing diagram illustrating the operation of the final refresh generator 670 in accordance with a comparative example of the present invention.

Referring to FIG. 10A, the auto-refresh command AFACT may be generated based on the external command address signal CA that does not go through the pulse width control unit 120. Therefore, the auto-refresh command AFACT may have a much wider pulse width than the predetermined pulse width (e.g., approximately 500 ps).

The second refresh command AFACT2ND is a command for performing a refresh operation two times within a refresh row cycle time tRFC in order to complement the refresh performance of a memory cell, although the auto-refresh command AFACT is inputted just once. The second refresh command AFACT2ND may be generated in the internal second refresh command generator 660.

The delayed/inverted auto-refresh command AFACTDB may be obtained by delaying the auto-refresh command AFACT by a predetermined duration and then inverting the delayed auto-refresh command AFACT.

The set signal generator 910 may generate the net signal NET by logically combining the signals. A logic operation may be performed on the net signal NET and the delayed/inverted auto-refresh command AFACTDB and then a logic operation result signal may be outputted, when the auto-refresh command AFACT or the second refresh command AFACT2ND is enabled. However, since the pulse width of the auto-refresh command AFACT is as wide as to include the pulse width of the second refresh command AFACT2ND, the pulse width of the delayed/inverted auto-refresh command AFACTDB is wide as well. Therefore, since the net signal NET may not be additionally enabled although the second refresh command AFACT2ND is enabled, the final refresh command REF is also enabled just once. Thus, the final refresh command REF may not be normally generated, which may lead to malfunction.

FIG. 10B is a timing diagram illustrating the operation of the final refresh generator 670 in accordance with an embodiment of the present invention.

Referring to FIG. 10B, the external command address signal CA having a wider pulse width than the predetermined pulse width e.g., approximately 500 ps) may be adjusted to have the predetermined pulse width by the pulse width control unit 120 and outputted as the second command address signal CA2. Since the auto-refresh command AFACT is generated based on the second command address signal CA2 which has the predetermined pulse width, the auto-refresh command AFACT may also have the predetermined pulse width.

For this reason, the delayed/inverted auto-refresh command AFACTDB may be also generated to have the same pulse width as the auto-refresh command AFACT. Therefore, the net signal NET is enabled when the auto-refresh command AFACT is enabled and when the second refresh command AFACT2ND is enabled, and thereby the final refresh command REF may be normally generated. In this way, it is possible to perform a normal refresh operation.

Figure 11:
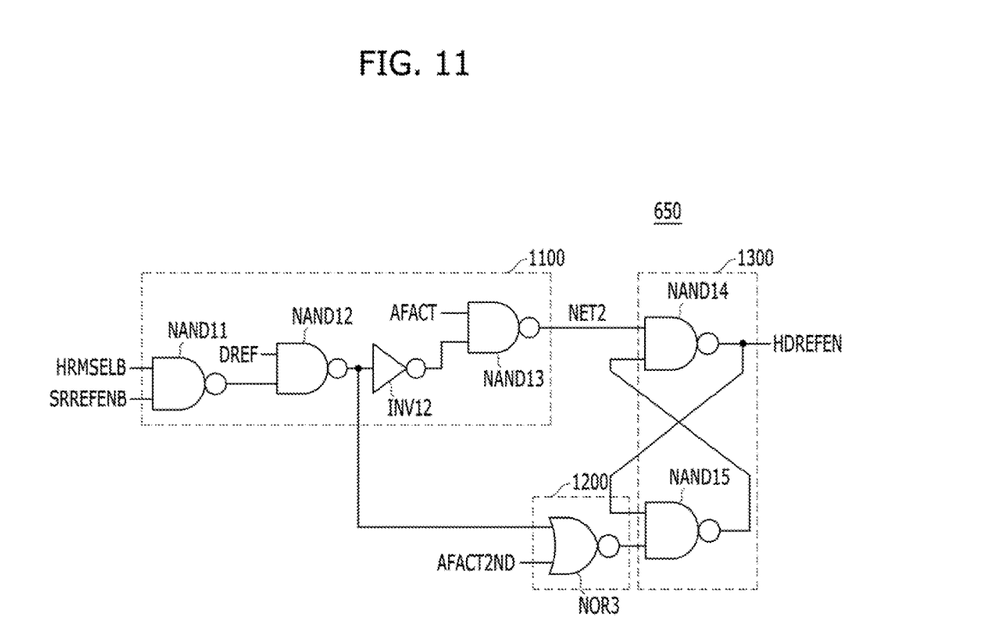
FIG. 11 is a circuit diagram illustrating an internal second refresh controller shown in FIG. 6.

FIG. 11 is a circuit diagram illustrating an internal second refresh controller 650 shown in FIG. 6.

Referring to FIG. 11, the internal second refresh controller 650 may include a set signal generator 1100, a reset signal generator 1200, and a latch 1300.

The set signal generator 1100 may include a plurality of NAND gates NAND11, NAND12 and NAND13, and an inverter INV12.

The NAND gates NAND11, NAND12 and NAND13 and the inverter INV12 may generate a net signal NET2 by performing a logic operation on the auto-refresh command AFACT, the double refresh signal DREF, the section selection signal HRMSELB, and the smart refresh enable signal SRREFENB.

The reset signal generator 1200 may be formed of a NOR gate NOR3. The reset signal generator 1200 may perform a logic operation on an output signal outputted from the $12^{th}$ NAND gate NAND12 and the second refresh command AFACT2ND and output a logic operation result.

The latch 1300 may include an SR latch that is formed of two NAND gates NAND14 and NAND15. The latch 1300 may receive the net signal NET2 as a set signal, receive a signal outputted from the reset signal generator 1200 as a reset signal, and generate the double refresh enable signal HDREFEN. The double refresh enable signal HDREFEN may be enabled in response to the net signal NET2, and may be disabled in response to the signal outputted from the reset signal generator 1200.

Hereafter, the operation of the internal second refresh controller 650 is described.

The smart refresh enable signal SRREFENB is a signal that is enabled during a smart refresh operation. The smart refresh enable signal SRREFENB may stay in a logic low level in the other refresh sections that are not a smart refresh operation section.

The double refresh signal DREF is a signal for increasing the number of internal refresh operations into two times with respect to one auto-refresh command AFACT which is inputted once. The double refresh signal DREF may be an enabling signal that controls the operation of the internal second refresh controller 650.

The section selection signal HRMSELB may be a signal for increasing the number of internal refresh operations into two times with respect to one auto-refresh command AFACT which is inputted once within a predetermined section. The section selection signal HRMSELB does not make all the internal refresh operations be performed two times with respect to one auto-refresh command AFACT.

To sum up, when a double refresh operation is performed in the internal second refresh controller 650, the double refresh signal DREF may be in a logic high level, and the smart refresh enable signal SRREFENB may be in a logic low level, and the section selection signal HRMSELB may be in a logic high level or in a logic low level. Also, the auto-refresh command AFACT may be inputted while maintaining a predetermined pulse width.

Therefore a signal outputted from the $11^{th}$ NAND gate NAND11 may be in a logic high level, and a signal outputted from the $12^{th}$ NAND gate NAND12 may be in a logic low level. The $13^{th}$ NAND gate NAND13 may output the net signal NET2 in a logic low level in a section where the auto-refresh command AFACT is inputted. In short, the enabling of the net signal NET2 may be controlled based on the auto-refresh command AFACT.

Also, the third NOR gate NOR3 may output a signal having a logic low level as a reset signal in response to the logic-low-level signal outputted from the $12^{th}$ NAND gate NAND12 and the second refresh command AFACT2ND that is enabled to a logic high level. In short, the enabling of the reset signal may be controlled based on the second refresh command AFACT2ND.

In other words, the double refresh enable signal HDREFEN may be enabled in response to the auto-refresh command AFACT, and may be disabled in response to the second refresh command AFACT2ND.

Figure 12A:
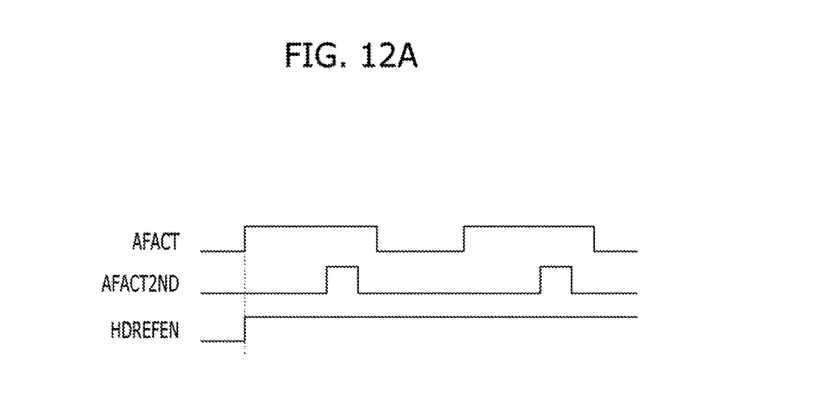
FIGS. 12A and 12B are timing diagrams illustrating examples of an operation of the internal second refresh controller shown in FIG. 11.
Figure 12B:
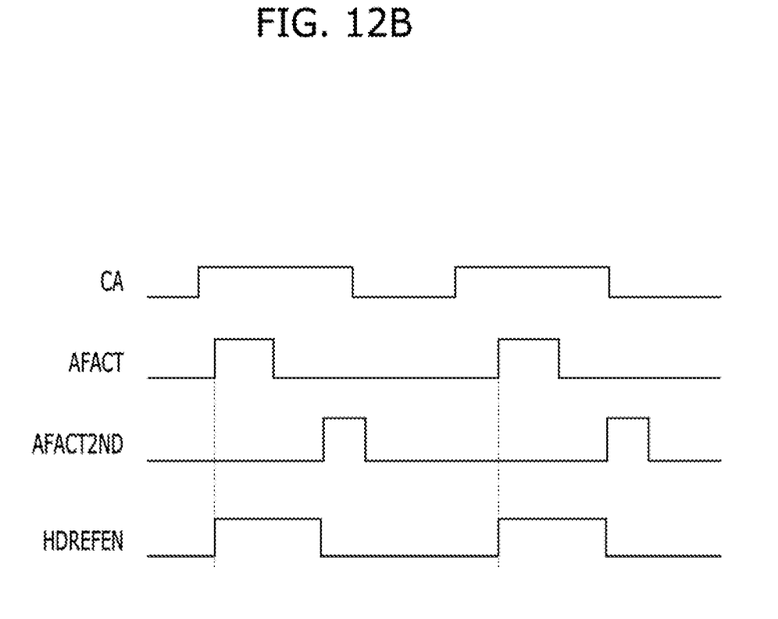

FIGS. 12A and 12B are timing diagrams illustrating examples of an operation of the internal second refresh controller 650 shown in FIG. 11.

FIG. 12A is a timing diagram illustrating the operation of the internal second refresh controller 650 in accordance with a comparative example of the present invention.

Referring to FIG. 12A, the auto-refresh command AFACT may be a signal generated based on the external command address signal CA that does not go through the pulse width control unit 120. Therefore, the auto-refresh command AFACT may have a much wider pulse width than the predetermined pulse width (e.g. approximately 500 ps).

Since the auto-refresh command AFACT is inputted with an abnormally wide pulse width, the double refresh enable signal HDREFEN, which is enabled according to the enabling of the auto-refresh command AFACT and disabled according to the enabling of the second refresh command AFACT2ND, may not be disabled although the second refresh command AFACT2ND is enabled and continue to be enabled. Therefore, when the internal refresh operation has to be performed two times during one auto-refresh operation, the internal refresh operation may be continuously performed more than three times or four times, which is malfunction.

FIG. 12B is a timing diagram illustrating the operation of the internal second refresh controller 650 in accordance with an embodiment of the present invention.

Referring to FIG. 12B, the external command address signal CA having a wider pulse width than the predetermined pulse width (e.g., approximately 500 ps) may be adjusted to have the predetermined pulse width by the pulse width control unit 120 and outputted as the second command address signal CA2 (not shown). Since the auto-refresh command AFACT is generated based on the second command address signal CA2 which has the predetermined pulse width, the auto-refresh command AFACT may also have the predetermined pulse width.

For this reason, the double refresh enable signal HDREFEN may be enabled in response to the auto-refresh command AFACT, and may be disabled in response to the second refresh command AFACT2ND, and thereby it is possible to perform an internal operation normally.

To sum up, when an external command address signal CA having a wider pulse width than a predetermined pulse width, the semiconductor memory device in accordance with the embodiments of the present invention may be able to adjust the pulse width into the predetermined pulse width to prevent malfunction internally. Also, when the external command address signal CA is inputted as a normal signal, the semiconductor memory device in accordance with the embodiments of the present invention may be able to output the signal as it is without adjustment. Therefore, the semiconductor memory device in accordance with the embodiments of the present invention may be able to perform an internal operation normally even though a signal having a wide pulse width is inputted from the exterior.

According to the embodiments of the present invention, a semiconductor memory device may perform a refresh operation normally by controlling the pulse width of an external command address to be uniform, when the semiconductor memory device performs a refresh operation based on the external command address under the condition of a low clock cycle tCK.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a high frequency signal control unit suitable for receiving an external command address signal, for removing noise and glitch from the external command address signal and outputting a first command address signal;
a pulse width control unit suitable for outputting a second command address signal with a first predetermined pulse width or with the same pulse width as the first command address signal in response to a pulse width of the first command address signal;
a refresh operation control unit suitable for generating a row address for a refresh operation in response to the second command address signal; and
a memory cell array suitable for performing the refresh operation in response to the row address,
wherein the high frequency signal control unit outputs the first command address signal inactivated when a pulse width of the external command address signal is narrower than a second predetermined pulse width.

2. The semiconductor memory device of claim 1, wherein the pulse width control unit includes:
a delayer that delays the first command address signal by a predetermined time and generates a delay signal; and
a signal combiner that combines the first command address signal and the delay signal to generate the second command address signal having the first predetermined pulse width or maintaining the pulse width of the first command address signal.

3. The semiconductor memory device of claim 2, wherein when the first command address signal has a narrower pulse width than the first predetermined pulse width, the signal combiner outputs the first command address signal while maintaining the pulse width of the first command address signal.

4. The semiconductor memory device of claim 2, wherein when the first command address signal has a wider pulse width than the first predetermined pulse width, the signal combiner adjusts the pulse width of the first command address signal into the first predetermined pulse width and outputs the first command address signal in the first predetermined pulse width.

5. The semiconductor memory device of claim 2, wherein the signal combiner includes an AND gate.

6. The semiconductor memory device of claim 2, wherein when the pulse width of the external command address signal is abnormally narrow, the high frequency signal control unit decides that the external command address signal includes the noise and the glitch and removes the noise and the glitch from the external command address signal.

7. The semiconductor memory device of claim 1, wherein the pulse width control unit includes:
an inverter that generates an inverted signal by inverting the first command address signal;
a delayer that delays the inverted first command address signal by a predetermined time and generates a delay signal; and
a signal combiner that combines the inverted first command address signal and the delay signal to generate the second command address signal having the first predetermined pulse width or maintaining the pulse width of the first command address signal.

8. The semiconductor memory device of claim 7, wherein the signal combiner includes a NOR gate.

9. The semiconductor memory device of claim 1, wherein the refresh operation control unit includes:
a redundancy refresh controller that generates a redundancy refresh command for refreshing a redundancy cell region in response to an auto-refresh command and a redundancy refresh enable signal;
an internal second refresh controller that generates a double refresh enable signal for performing a control to perform a double refresh operation in response to the auto-refresh command and a double refresh signal;

an internal second refresh command generator that generates a second refresh command for performing a refresh operation two times with respect to the auto-refresh command that is inputted once in response to the double refresh enable signal and the auto-refresh command;
a final refresh generator that generates a final refresh command in response to the auto-refresh command, the second refresh command, and a self-refresh command; and
a row address controller that generates the row address for refreshing the memory cell in response to the redundancy refresh command and the final refresh command.

10. The semiconductor memory device of claim 9, wherein the refresh operation control unit further includes:
a command decoder that generates the auto-refresh command by decoding the command address signal whose pulse width is adjusted by the pulse width control unit; and
a refresh counter that generates the redundancy refresh enable signal by counting the auto-refresh command.

11. The semiconductor memory device of claim 1, wherein the high frequency signal control unit includes:
a first delayer that delays the external command address signal by a first delay amount and generates a first delay signal; and
a first signal combiner that combines the external command address signal and the first delay signal to generate an intermediate signal;
a second delayer that delays the intermediate signal by a second delay amount and generates a second delay signal; and
a second signal combiner that combines the intermediate signal and the second delay signal to generate the first command address signal,
wherein the first delay amount is same as the second delay amount.

12. The semiconductor memory device of claim 11, wherein the second predetermined pulse width corresponds to the first delay amount.

13. A method for operating a semiconductor memory device, comprising:
removing noise and glitch from an external command address signal to generate a first command address signal;
adjusting a pulse width of the first command address signal, or maintaining the pulse width of the first command address signal to generate a second command address signal with a first predetermined pulse width;
generating an auto-refresh command based on the second command address signal; and
performing an internal refresh operation in response to the auto-refresh command,
wherein the adjusting of the pulse width of the first command address signal, or the maintaining of the pulse width of the first command address signal to generate the second command address signal with the predetermined pulse width includes:
adjusting the pulse width of the first command address signal into the first predetermined pulse width, when the first command address signal has a wider pulse width than the first predetermined pulse width,
wherein the first command address signal is inactivated when a pulse width of the external command address signal is narrower than a second predetermined pulse width.

14. The method of claim 13, wherein the adjusting of the pulse width of the first command address signal, or the maintaining of the pulse width of the first command address signal to generate the second command address signal with the first predetermined pulse width includes:
maintaining the pulse width of the first command address signal, when the first command address signal has a narrower pulse width than the first predetermined pulse width.

15. The method of claim 13, wherein the performing of the internal refresh operation in response to the auto-refresh command includes:
generating a redundancy refresh enable signal by counting the auto-refresh command; and
refreshing a redundancy cell region in response to the auto-refresh command and the redundancy refresh enable signal.

16. The method of claim 13, wherein the performing of the internal refresh operation in response to the auto-refresh command further includes:
generating a double refresh enable signal for performing a control to perform a double refresh operation in response to the auto-refresh command and/or a double refresh signal; and
generating a second refresh command for performing a refresh operation two times with respect to the auto-refresh command that is inputted once in response to the double refresh enable signal and the auto-refresh command.

17. The method of claim 16, wherein the performing of the internal refresh operation in response to the auto-refresh command further includes:
generating a final refresh command in response to the auto-refresh command, the second refresh command, and a self-refresh command;
generating a row address for performing a refresh operation in response to the redundancy refresh command and the final refresh command; and
performing a refresh operation in response to the row address.

* * * * *